(12) United States Patent
La Rosa et al.

(10) Patent No.: US 10,002,906 B2
(45) Date of Patent: Jun. 19, 2018

(54) METHOD FOR FABRICATING AN ARRAY OF DIODES, IN PARTICULAR FOR A NON-VOLATILE MEMORY, AND CORRESPONDING DEVICE

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days. days.

(21) Appl. No.: 15/365,143

(22) Filed: Nov. 30, 2016

(65) Prior Publication Data
US 2017/0352703 A1    Dec. 7, 2017

(30) Foreign Application Priority Data
Jun. 3, 2016   (FR) ..................... 16 55067

(51) Int. Cl.
| G11C 11/36 | (2006.01) |
| H01L 27/24 | (2006.01) |
| H01L 27/12 | (2006.01) |
| H01L 45/00 | (2006.01) |

(52) U.S. Cl.
CPC ...... *H01L 27/2409* (2013.01); *H01L 27/1203* (2013.01); *H01L 45/06* (2013.01); *H01L 45/16* (2013.01)

(58) Field of Classification Search
CPC . H01L 27/2409; H01L 27/1203; H01L 45/06; H01L 45/16

USPC .......................................................... 365/175
See application file for complete search history.

(56) References Cited

U.S. PATENT DOCUMENTS

| 5,414,245 A | * | 5/1995 | Hackleman | ............ B41J 2/1603 219/543 |
| 6,369,431 B1 | * | 4/2002 | Gonzalez | .......... H01L 21/28518 257/329 |
| 6,865,117 B2 | * | 3/2005 | Kozicki | ................. B82Y 10/00 257/E27.004 |
| 9,458,109 B2 | * | 10/2016 | Wang | ................... C07D 217/20 |
| 2003/0206481 A1 | | 11/2003 | Hsu et al. | |
| 2004/0108528 A1 | | 6/2004 | Hsu et al. | |
| 2006/0279328 A1 | * | 12/2006 | Kozicki | ................ H01L 27/118 326/41 |
| 2007/0215885 A1 | * | 9/2007 | Miyoshi | ................ H01L 29/267 257/88 |
| 2008/0179602 A1 | * | 7/2008 | Negley | ............... H01L 21/2654 257/88 |

(Continued)

FOREIGN PATENT DOCUMENTS

| CN | 1503365 A | 6/2004 |
| CN | 101106151 A | 1/2008 |

*Primary Examiner* — Viet Q Nguyen
(74) *Attorney, Agent, or Firm* — Seed IP Law Group LLP (57) ABSTRACT

The array of diodes comprises a matrix plane of diodes arranged according to columns in a first direction and according to rows in a second direction orthogonal to the first direction. The said diodes comprise a cathode region of a first type of conductivity and an anode region of a second type of conductivity, the said cathode and anode regions being superposed and disposed on an insulating layer situated on top of a semiconductor substrate.

21 Claims, 8 Drawing Sheets

(56) References Cited

U.S. PATENT DOCUMENTS

| | | | |
|---|---|---|---|
| 2009/0218591 A1* | 9/2009 | Grolier | H01L 51/5253 257/100 |
| 2009/0251940 A1* | 10/2009 | Ito | H01L 27/24 365/51 |
| 2010/0148324 A1* | 6/2010 | Chen | H01L 27/2418 257/656 |
| 2010/0171086 A1* | 7/2010 | Lung | H01L 45/1683 257/2 |
| 2010/0301304 A1* | 12/2010 | Chen | H01L 21/743 257/5 |
| 2011/0037054 A1* | 2/2011 | Shieh | H01L 27/3204 257/40 |
| 2012/0001305 A1* | 1/2012 | Peroni | H01L 29/417 257/656 |
| 2012/0051137 A1* | 3/2012 | Hung | G11C 16/0466 365/185.17 |
| 2012/0261804 A1* | 10/2012 | Li | H01L 27/0255 257/653 |
| 2013/0119505 A1* | 5/2013 | Harame | H01L 29/47 257/484 |
| 2013/0258532 A1* | 10/2013 | Clark, Jr. | H01L 27/1211 361/56 |
| 2013/0285111 A1* | 10/2013 | Di Sarro | H01L 21/84 257/107 |
| 2014/0160830 A1* | 6/2014 | Chung | G11C 13/0004 365/96 |
| 2014/0239343 A1* | 8/2014 | Di Sarro | H01L 29/66121 257/121 |
| 2015/0104921 A1* | 4/2015 | Terai | H01L 45/16 438/382 |
| 2017/0047321 A1* | 2/2017 | Nishimura | H01L 27/0664 |
| 2017/0194298 A1* | 7/2017 | Negley | H01L 25/0756 |

\* cited by examiner

METHOD FOR FABRICATING AN ARRAY OF DIODES, IN PARTICULAR FOR A NON-VOLATILE MEMORY, AND CORRESPONDING DEVICE

BACKGROUND

Technical Field

Various embodiments of the disclosure and their implementation relate to p-n junction diodes, and more particularly diode selector arrays used notably in non-volatile memories such as resistive memories (RRAM) or phase-change memories (PCRAM).

Description of the Related Art

Usually, the memories of the RRAM and PCRAM type comprise a memory plane comprising memory cells designed to store a binary data value, with a matrix arrangement in rows and columns. The access to a row generally takes place via a metal track referred to as word line and the access to a column generally takes place via a metal track referred to as bit line.

The controls for accessing the memory locations of the memories of the RRAM and PCRAM type can be formed by a selector array comprising diodes, which may for example be disposed under the memory plane of the memories.

In summary, each memory cell is connected to a word line and to a bit line, and the various configurations of the voltages applied to the word and bit lines allow a data value in a memory cell to be read, to be programmed or to be erased.

Each memory cell is connected in series with a diode of the selector array whose forward or reverse conducting state or non-conducting state, depending on the voltages, allows a given memory cell to be selected.

BRIEF SUMMARY

The diodes of the selector array are conventionally directly formed in a semiconductor substrate, which can introduce undesirable bipolar effects.

Indeed, recurrent problems have been observed in the use of diodes whose doped regions are directly implanted into the substrate or into a well. These undesirable bipolar effects are for example due to parasitic p-n junctions with the substrate and are generally observed at power-up and during the use of the array.

It is desirable to avoid these parasitic bipolar effects with the substrate, in a manner that is simple and is compatible with the technologies for non-volatile memories.

Furthermore, certain etch processes in the usual methods for fabrication of diodes exhibit constraints with regard to size reduction, for example owing, on the one hand, to masks requiring a precise alignment and, on the other hand, owing to a variation in the form factor of the etched structures.

As a consequence, it is also desirable to improve the control of the said etch processes.

For this purpose, a method for fabricating an array of diodes is provided, comprising:

the formation of an initial structure comprising
the formation of an insulating layer on the surface of a semiconductor substrate and
the formation of a first layer of silicon of a first type of conductivity on the insulating layer, then
the formation of a buffer layer on the first layer of silicon,
the etching of the buffer layer in strips running in a first direction,
the formation of a second layer of silicon of a second type of conductivity,
the etching down to the insulating layer of the second layer of silicon, of the strips of the buffer layer and of the first layer of silicon, in strips running in a second direction orthogonal to the first direction, and
the removal, by etching in the second layer of silicon and down to the buffer layer, of strips running in the first direction situated facing the strips of the buffer layer, so as to form pads of silicon of the second type of conductivity.

As a variant, the step for formation of the initial structure is replaced by the use of a substrate of the fully-depleted silicon-on-insulator type (well known to those skilled in the art under the acronym FDSOI) whose semiconductor film is doped with the first type of conductivity.

The first and/or the second layer of silicon may comprise polycrystalline silicon.

According to one variant, the initial structure is a substrate of fully-depleted silicon-on-insulator whose semiconductor film is doped in order to form the first layer of silicon and whose second layer of silicon is formed by epitaxial growth.

The first and second layers of silicon may be doped in-situ or by implantation.

According to one embodiment, the strips removed by etching in the second layer of silicon and down to the buffer layer are narrower than the strips of the buffer layer.

The buffer layer advantageously comprises a layer of an insulating material; for example the buffer layer may comprise a superposition of oxide-nitride-oxide of silicon or a layer of silicon nitride of $Si_3N_4$.

According to one embodiment, the strips of the first layer of silicon running in the second direction are connected to respective metal tracks running in the second direction, via metal contacts regularly disposed in the second direction.

According to one embodiment, each pad of silicon of the second type of conductivity is connected to memory cells via metal contacts.

According to another aspect, a device is provided comprising an array of diodes comprising a matrix plane of diodes arranged according to columns in a first direction and according to rows in a second direction orthogonal to the first direction, the said diodes comprising a cathode region of a first type of conductivity and an anode region of a second type of conductivity, the said cathode and anode regions being superposed and disposed on an insulating layer situated on top of a semiconductor substrate.

According to one embodiment, the cathode regions are common to the diodes of the same row and take the form of a strip running in the second direction, and the anode regions take the form of a pad and are in contact with the cathode region.

The cathode regions are advantageously situated directly on the insulating layer.

According to one embodiment, the anode regions of the diodes of the same row are separated from one another by portions of the strips of a buffer layer and straddle the edges of the said portions of strips.

According to one embodiment, the anode regions are connected to respective memory cells via metal contacts.

The cathode regions may also be connected in parallel to respective metal tracks running in the second direction, via metal contacts regularly disposed in groups of at least one diode.

In other words, the various embodiments and their implementation provided relate to diodes completely insulated from the substrate. As a result, no parasitic bipolar effect with the substrate due to a p-n junction between a doped region of the diode and the substrate can occur.

According to another aspect, a non-volatile memory is also provided comprising a memory plane and a device such as defined hereinbefore forming a selector array of diodes designed to select the memory cells of the memory plane.

The non-volatile memory may for example be of the resistive or phase-change memory type.

Indeed, the various embodiments and their implementation provided are notably totally compatible with the technological constraints of use and of fabrication of non-volatiles memories, in particular the non-volatiles memories of the RRAM and PCRAM type.

For example, the embodiments provided allow the diodes to be formed without adding a masking step, critical as regards alignment, for the etch process finalizing the formation of pads of silicon.

Furthermore, the various masking steps advantageously only employ masks taking the form of strips, notably allowing the contact surface of the said masks to be increased, with respect to a conventional etch process in which the masks take the form of pads, notably improving the control of the form factor of the etch, in particular for reduced dimension.

Thus, the embodiments and their implementation provided are optimized for the technological node, notably as regards the minimization of the surface occupied by the selector array of diodes.

BRIEF DESCRIPTION OF THE SEVERAL VIEWS OF THE DRAWINGS

Other advantages and features of the disclosure will become apparent upon examining non-limiting embodiments of the disclosure and their implementation and from the appended drawings in which.

DETAILED DESCRIPTION

FIGS. 1 to 7 comprise a top view of a portion of a selector array of diodes at various stages in the implementation of its method of fabrication, together with, for the sake of clarity, cross-sectional views through planes respectively referenced AA, BB and CC.

Figure 1:
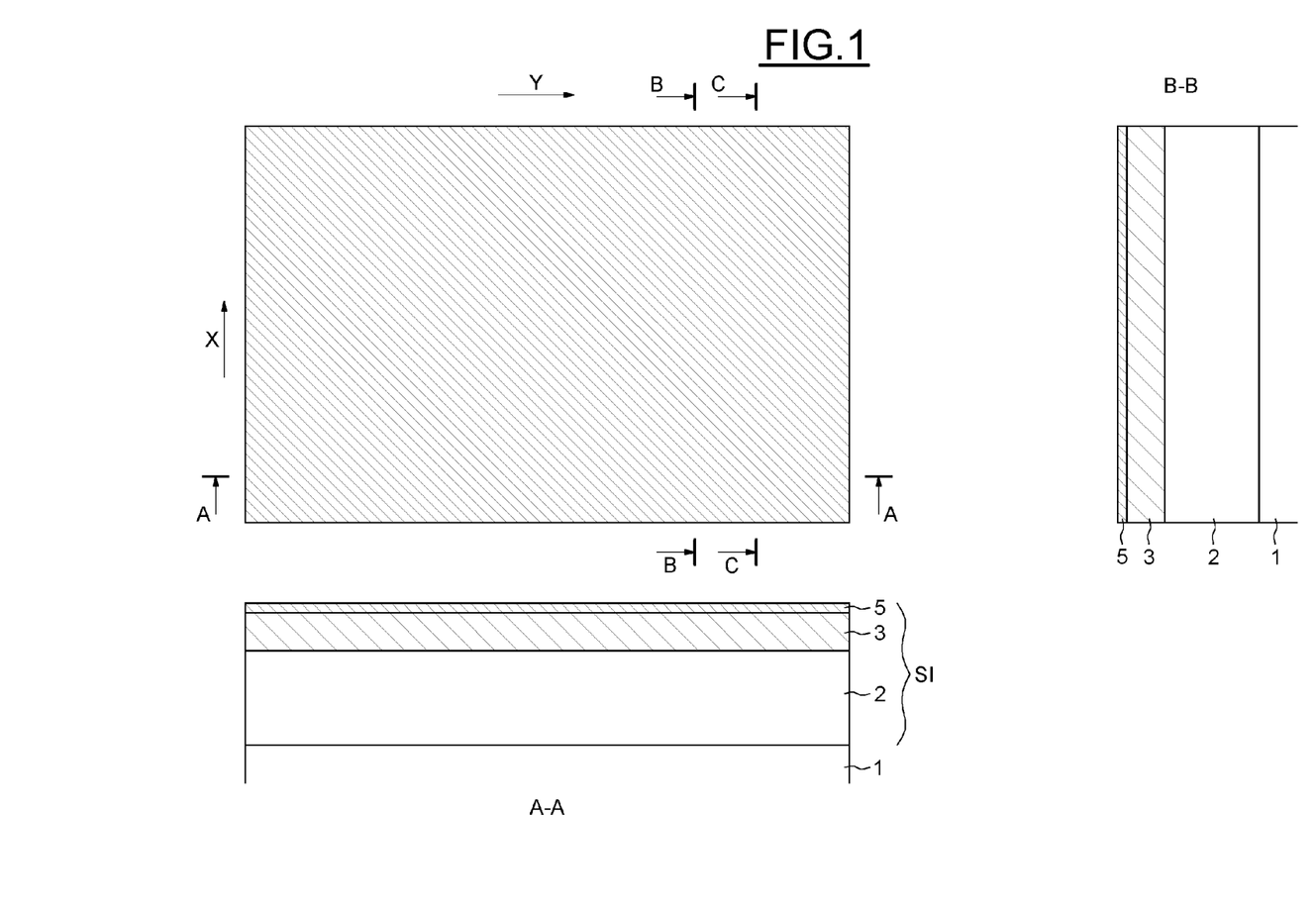
FIGS. 1 to 7 show steps of one embodiment of a method for fabricating a selector array of diodes.

FIG. 1 shows an initial step during which a buffer layer 5 is deposited on a structure called initial structure IS.

The initial structure IS may be obtained for example by forming an insulating layer 2, for example of a dielectric material, on a semiconductor substrate 1, and by depositing a first layer of silicon 3, for example polycrystalline silicon, of a first type of conductivity (for example of the n type). As used herein, the word "silicon" by itself (as opposed to with another material such as silicon nitride or silicon oxide) is intended to refer to semiconductive silicon, and one skilled in the art would understand that such semiconductive silicon could be replaced by an alternate semiconductor such as germanium or gallium arsenide.

In the following, the usual term "polysilicon" is employed to denote polycrystalline silicon.

As a variant, the initial structure IS may be a structure of the conventional FDSOI substrate type, comprising a semiconductor film on top of a buried insulating layer (BOX: "Buried Oxide") itself on top of a carrier substrate. The initially intrinsic semiconductor film of the FDSOI substrate is doped in order to form the layer of silicon 3 of the first type of conductivity, for an application using FDSOI technology which is advantageous in certain technological nodes.

The BOX layer forms the insulating layer 2 and the carrier substrate forms the substrate 1.

The buffer layer 5 is formed from an insulating material, which may for example be a superposition of layers of silicon oxide, silicon nitride and silicon oxide, or else a single layer of silicon nitride ($Si_3N_4$).

At this stage, the cross-sectional view through the plane CC is identical to the cross-sectional view through the plane BB, and as a consequence is not shown here.

Figure 2:
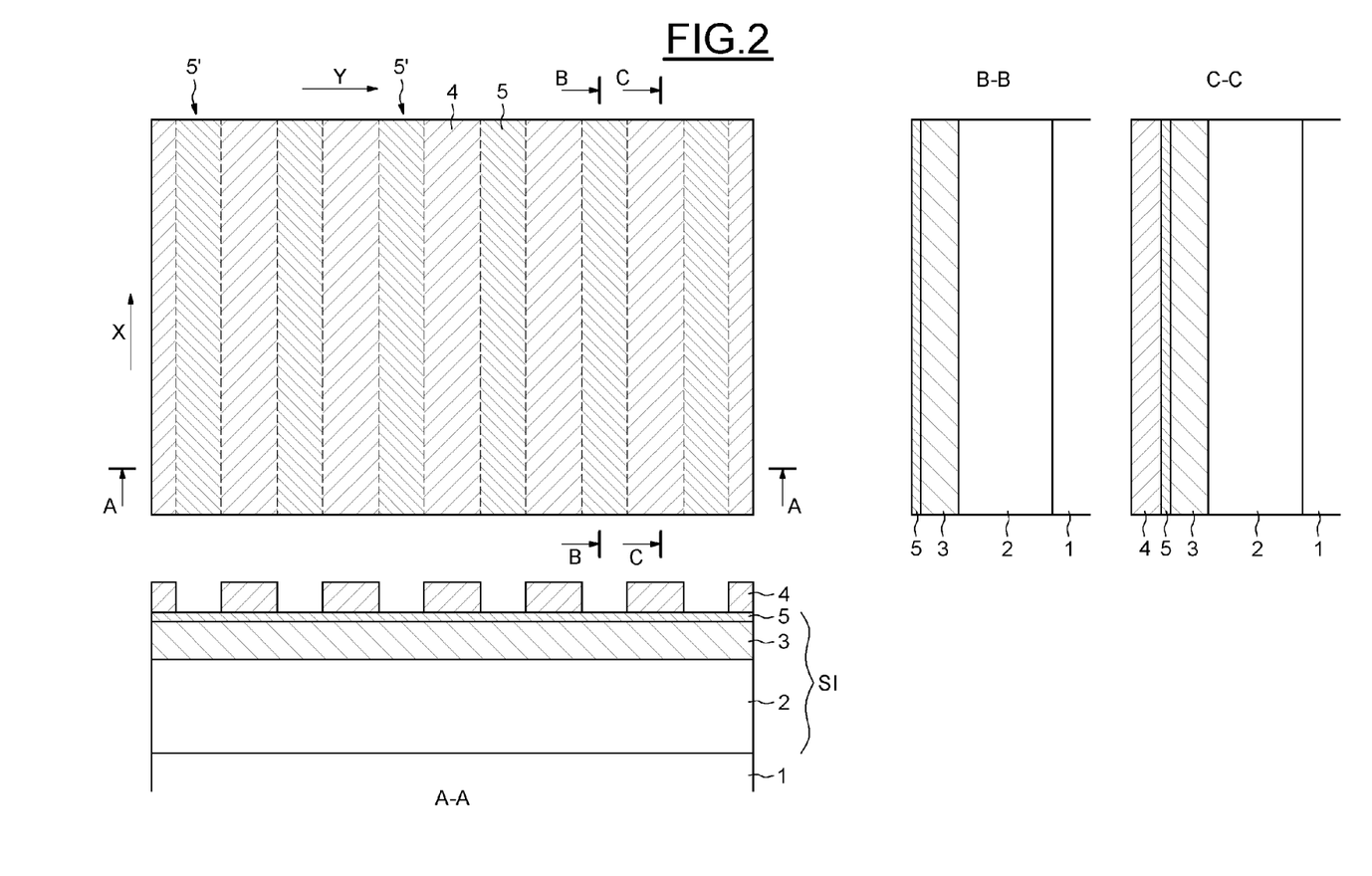

FIG. 2 shows a masking step, during which a resist mask 4 has been formed on the buffer layer 5.

The resist mask 4 is configured so that the uncovered part of the buffer layer 5 forms strips 5' running lengthwise in a first direction X.

Figure 3:
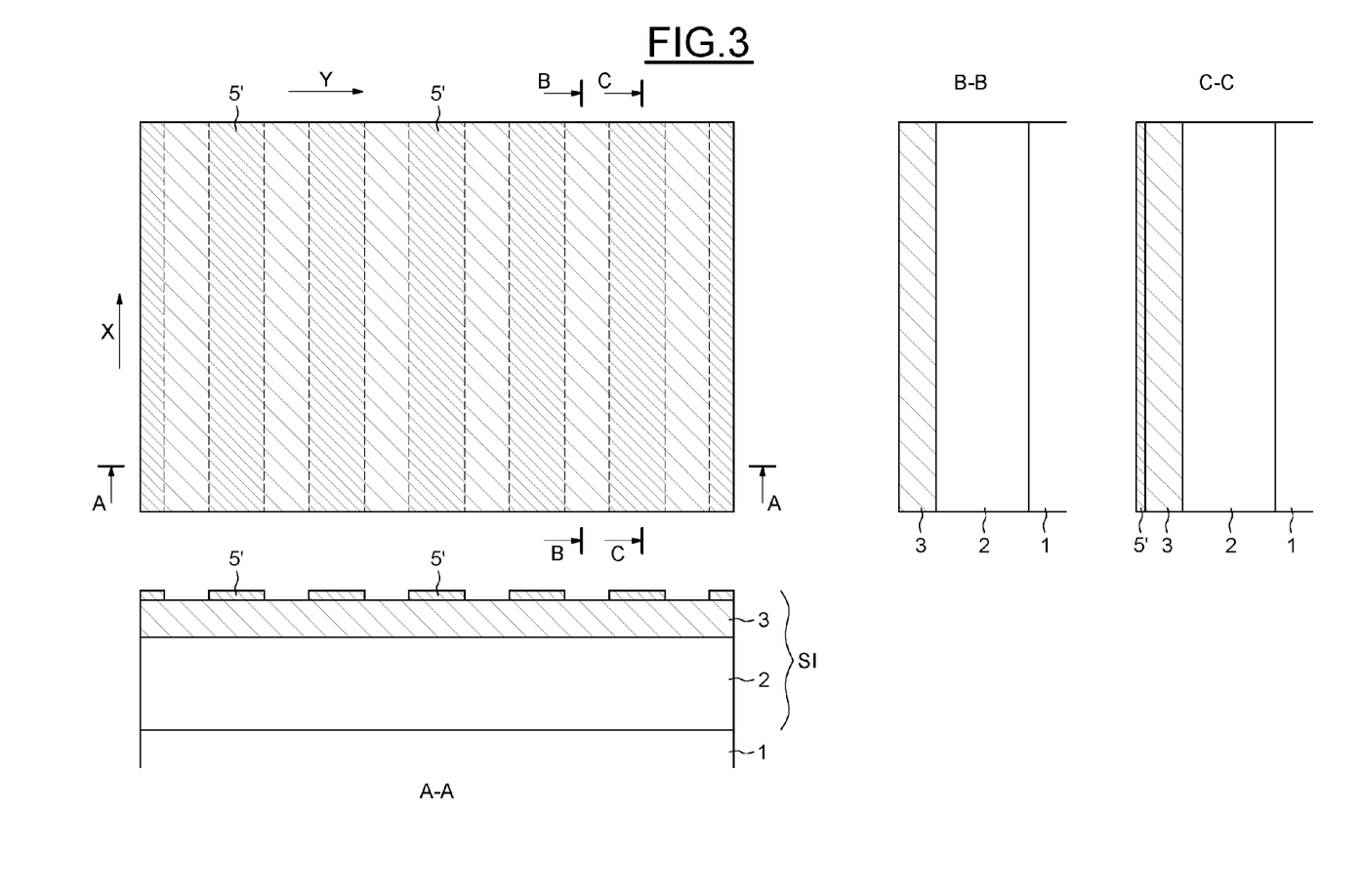

FIG. 3 shows the result of the selective etching of the buffer layer 5 down to the first layer of silicon 3, and of the removal of the resist mask 4, which leaves the strips 5' of the buffer layer on the first layer of silicon 3.

Figure 4:
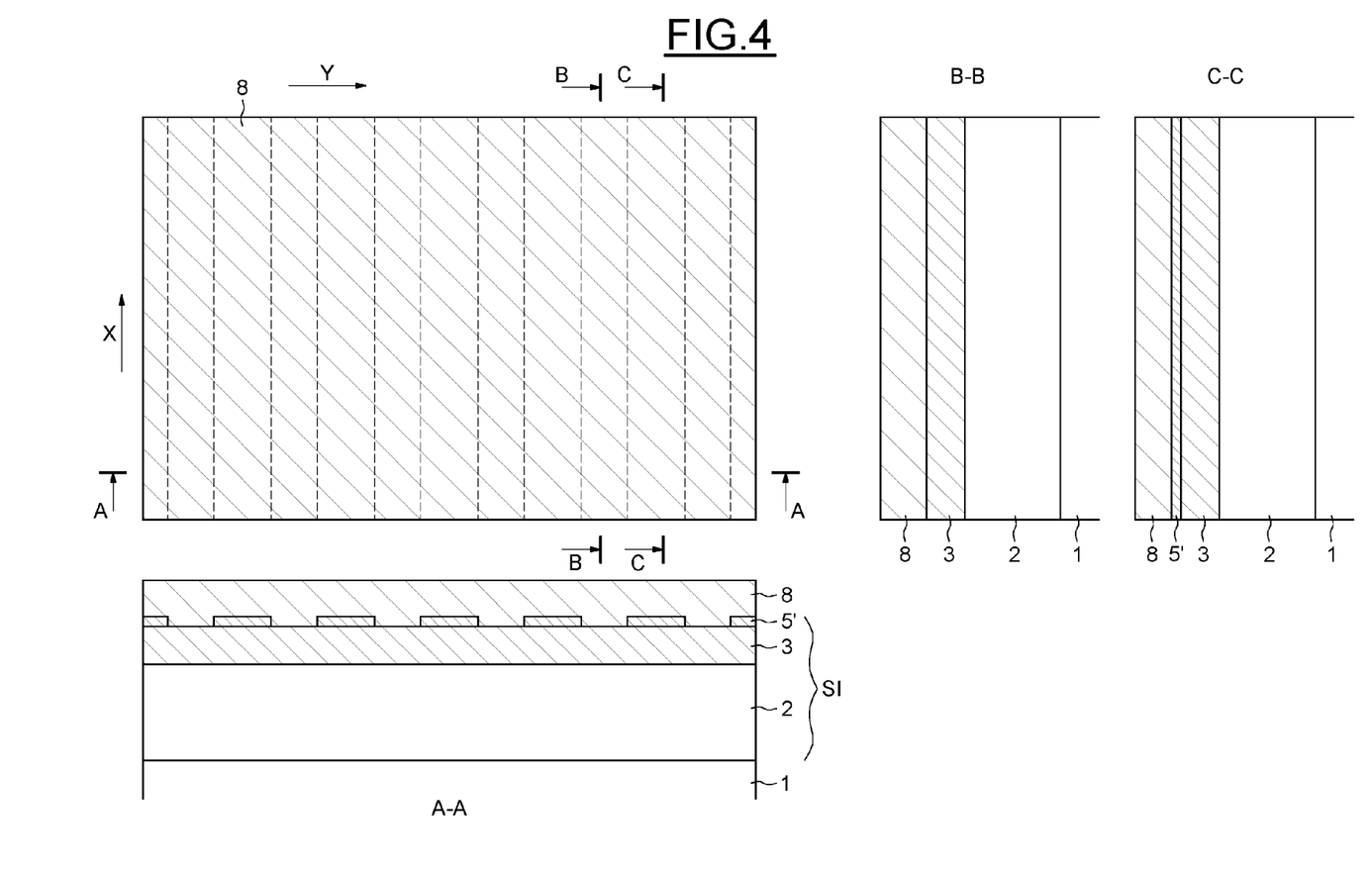

FIG. 4 shows a step during which a second layer of silicon 8 of a second type of conductivity (for example of the p type) has been formed on the structure previously obtained relating to FIG. 3.

The second layer of silicon 8 may for example be formed by deposition of polysilicon or may be obtained by epitaxial growth.

Figure 5:
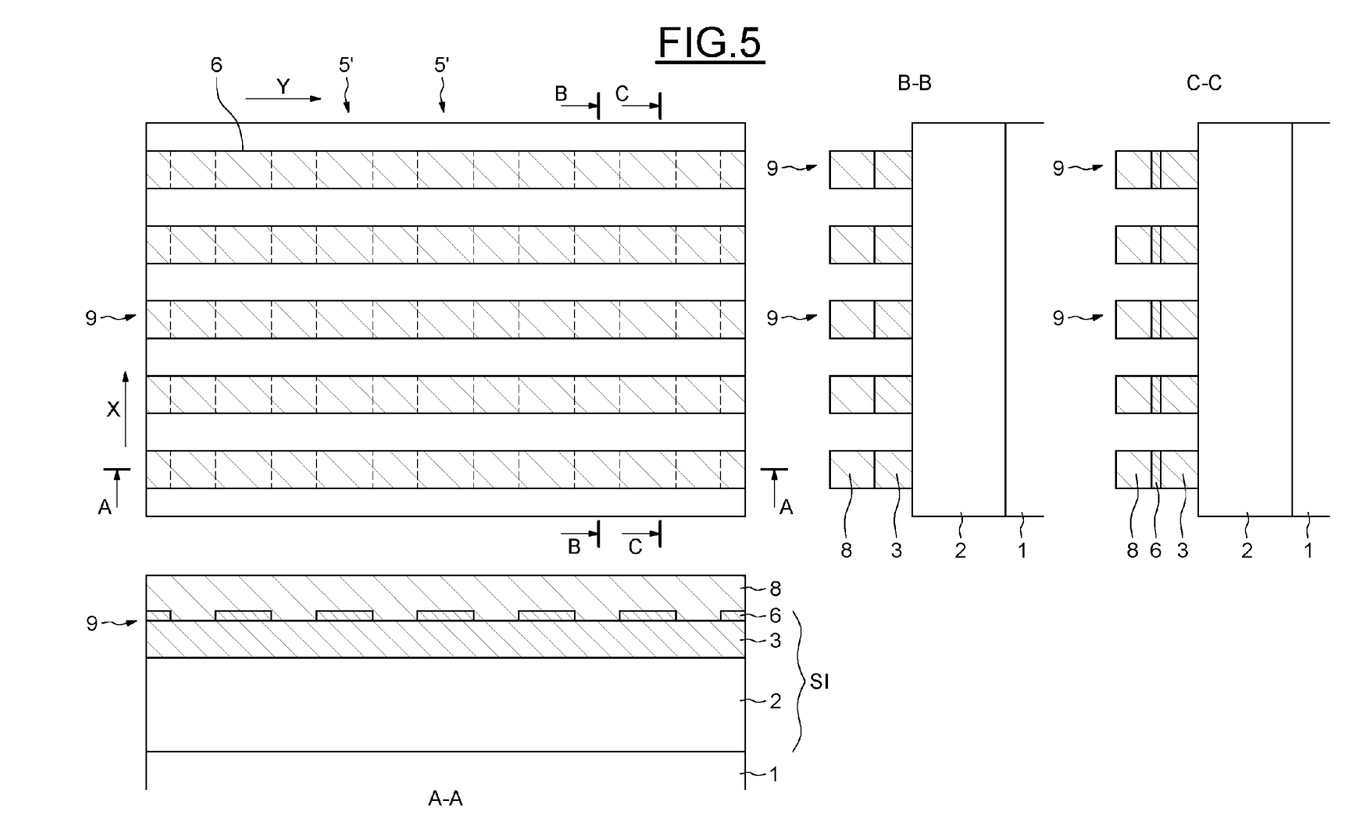

FIG. 5 shows the result of an etching step using a mask similar to the step described in relation with FIG. 2, but leaving uncovered strips running lengthwise in a second direction Y, orthogonal to the first direction X.

During this etching step, the second layer of silicon 8, the strips 5' of the buffer layer 5 and the first layer of silicon 3 are etched.

The etch is stopped by the insulating layer 2 and is carried out in order that the remaining parts of the three etched layers 3, 5, 8 take the form of strips 9 running lengthwise in the second direction Y.

The remaining parts of the strips 5' of the buffer layer form portions of strips and are represented by dashed lines carrying the reference 6 in this representation and also in the following.

Figure 6:
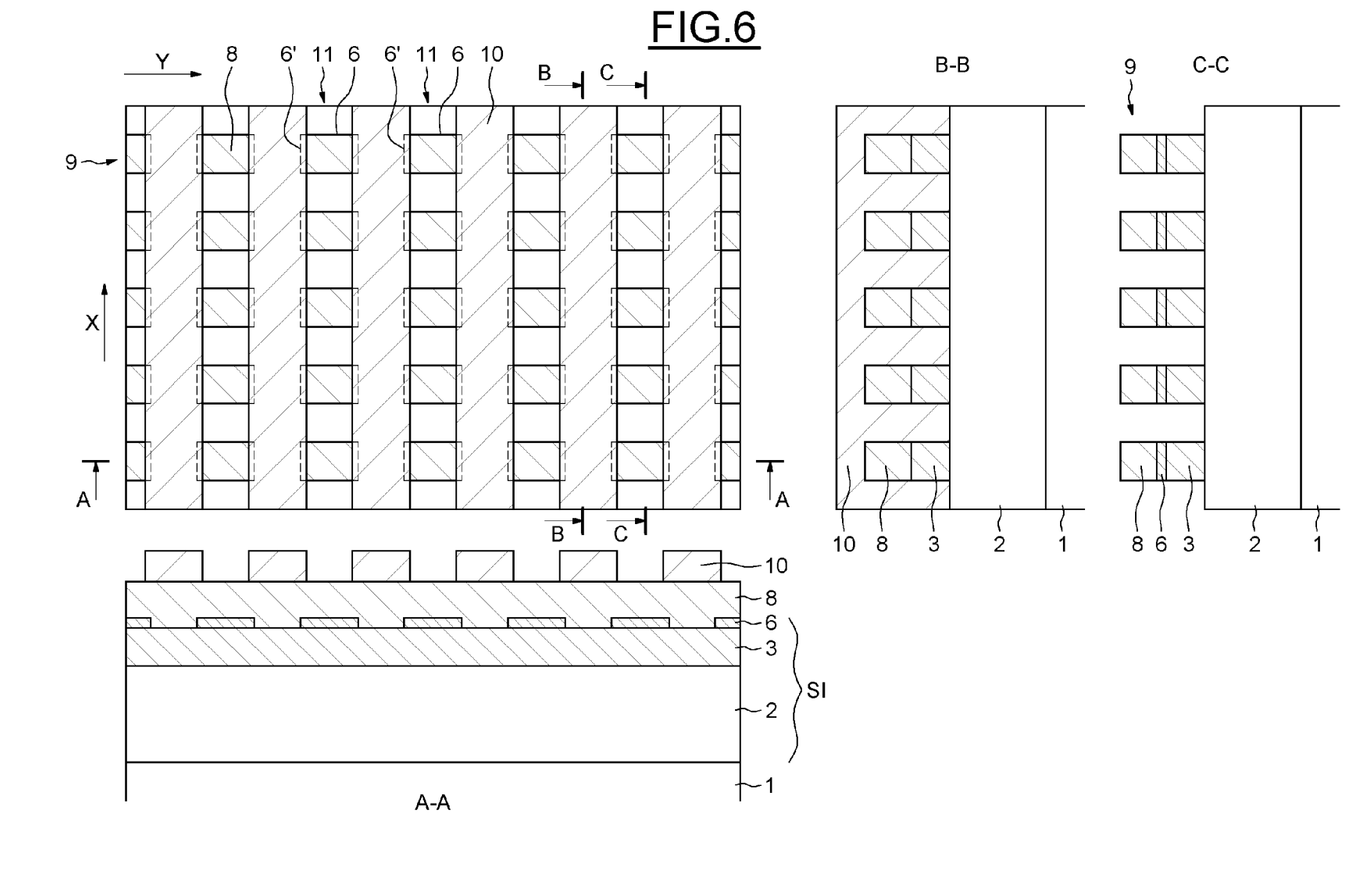

FIG. 6 shows a masking step during which a mask 10 leaves uncovered strips 11 running lengthwise in the first direction X of the strips 9 previously obtained relating to FIG. 5.

The uncovered strips 11 are situated facing the portions of strips 6 of the buffer layer 5, and are narrower than the strips 5' of the buffer layer 5 previously obtained.

Thus, this masking step is not critical with regard to alignment because, as will be seen in more detail hereinafter, the surface of the active region of the diodes depends on the disposition of the portions of strips 6 of the buffer layer 5 and not on the alignment of the mask for this etch process.

Figure 7:
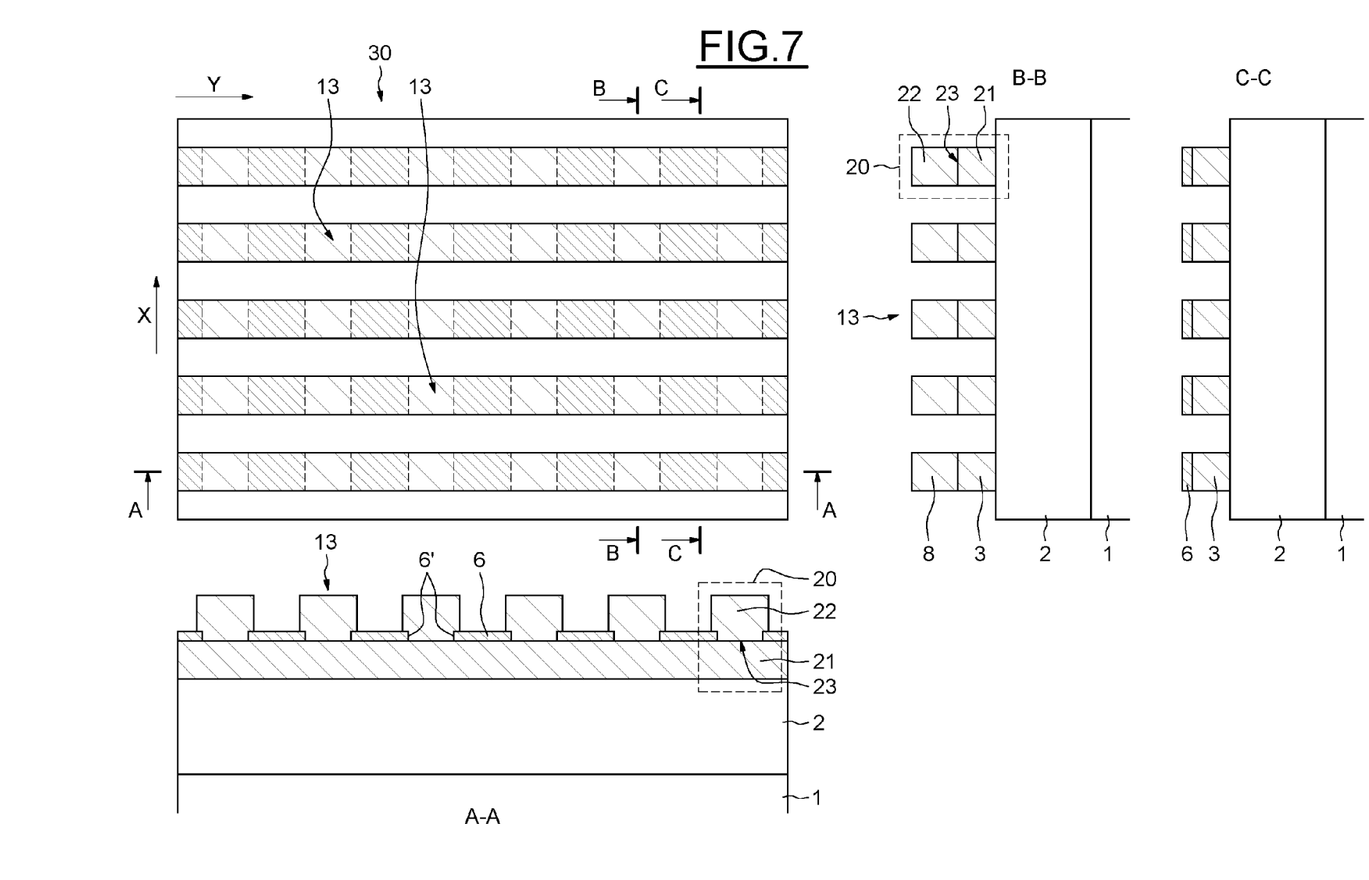

FIG. 7 shows the structure obtained after a selective etching of the second layer of silicon 8 down to the buffer layer 5 and the removal of the mask 10.

The remaining parts of the second layer of silicon 8, etched in strips in two orthogonal directions, form pads 13 of square or rectangular shape.

Thus, the pads 13 of silicon of the second type of conductivity, form anodes 22 of diodes 20 arranged as a matrix according to the two directions X and Y. The cathodes 21 of the diodes 20 are formed by strips 9' of the first layer of silicon 3 that remain after the portions of the second silicon layer 8 of the strip 9 are removed in the selective etch depicted in FIG. 7. Each remaining strip 9' of the first silicon layer is common to all the diodes of a respective row of a selector array 30 of diodes 20 thus formed.

The cathode 21 and the anode 22 of a diode 20 are in contact at an interface 23, forming a p-n junction. The surface of the interface 23 corresponds to the surface included between two portions of strips 6 of the buffer layer, bounded by the edges 6' of the said portions of strips 6.

Furthermore, the diodes 20 formed by this method are totally insulated from the semiconductor substrate 1 by the insulating layer 2, which, consequently, are not subject to a parasitic bipolar effect with the substrate.

Figure 8:
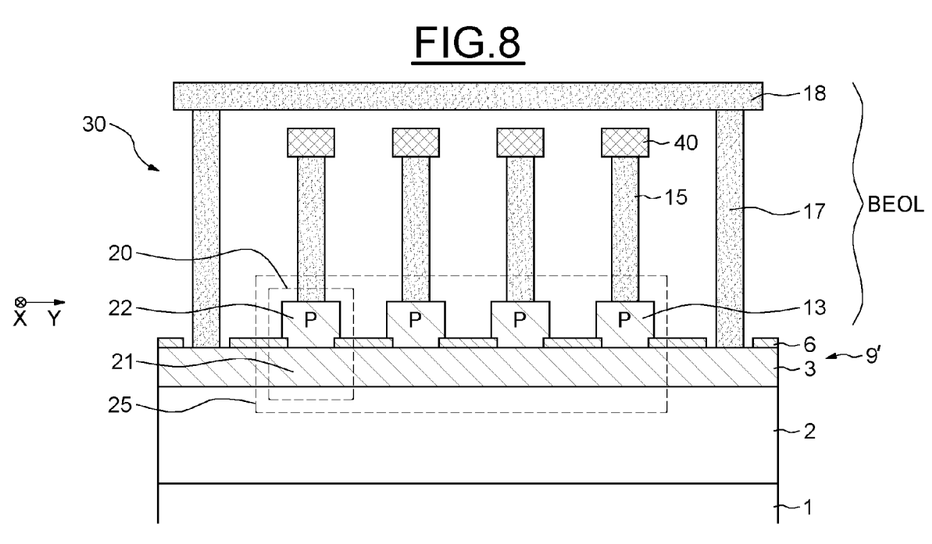
FIGS. 8 and 9 show one embodiment of a selector array of diodes.

FIG. 8 shows a cross-sectional view of one embodiment of a selector array, corresponding to the structure, relating to FIG. 7, obtained by the method previously described.

Figure 9:
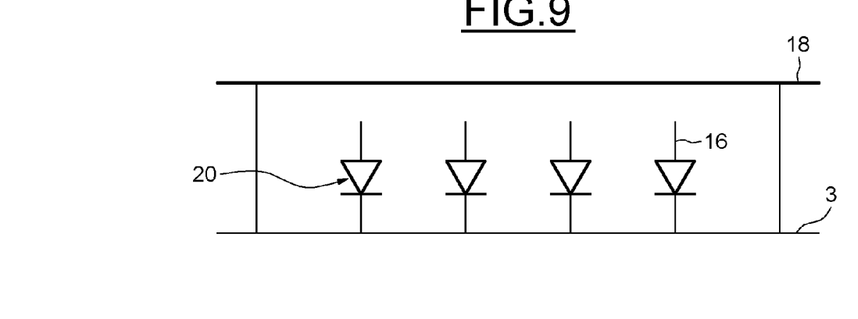

FIG. 9 shows the electronic circuit diagram of the embodiment illustrated in FIG. 8.

Contacts 15 have been formed connecting the anodes 22 of the diodes 20 to respective memory cells 40 situated within a section of back-end-of-line (BEOL) interconnections, shown very schematically here.

The strips 9' of the first layer of silicon 3 form word lines. However, in order to reduce the resistivity of the word lines, a "strapping" (according to a commonly used term) of the polysilicon 3 is advantageously carried out.

The strapping corresponds to the connection in parallel of the strip 9' of polysilicon with a metal track 18 running in the second direction Y.

The connection between the strip 9' and the track 18 is made by metal contacts 17 regularly disposed in the second direction Y, along the word line, in groups 25, here, of four diodes 20.

In other words, on each word line, a contact 17 connects the metal track 18 in parallel with the strip 9' of polysilicon between each group 25 of diodes 20.

The number of diodes 20 per group 25 can vary according to the intended use of the selector array 30, notably as a function of the applied currents and of the resistivity of the first layer of silicon 3.

It is also possible for a group to only contain a single diode 20, in which case a contact 17 made between each of the single diodes 20 connects the strip 9' of silicon to a metal track 18.

In summary, according to one embodiment, the formation of a selector array is described comprising a matrix plane of diodes arranged according to columns in a first direction and according to rows in a second direction orthogonal to the first direction. The diodes comprise a cathode region of a first type of conductivity and an anode region of a second type of conductivity, the said cathode and anode regions being superposed and in contact on an interface whose surface is controlled. The diodes are disposed on an insulating layer formed on the surface of a semiconductor substrate, allowing the diodes to be insulated from the rest of the substrate.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a semiconductor substrate;
an insulating layer situated on top of the semiconductor substrate;
an array of diodes arranged according to columns in a first direction and according to rows in a second direction orthogonal to the first direction, each diode including a cathode region of a first type of conductivity and an anode region of a second type of conductivity, the cathode and anode regions being superposed on each other and disposed on the insulating layer such that the insulating layer insulates the diodes from the semiconductor substrate; and
buffer portions of an insulating material separating the anode regions of the diodes of a same row from one another, the buffer portions having edges that are straddled by edge portions of the anode regions;
wherein the cathode regions are situated directly on the insulating layer and between the anode regions and the insulating layer.

2. The device according to claim 1, in which the cathode regions are respective portions of semiconductor strips running lengthwise in the second direction, wherein, for each row, the cathode regions of the diodes of the row are portions of a corresponding one of the semiconductor strips and the anode regions of the diodes of the row are semiconductor pads respectively in contact with the cathode regions of the row.

3. The device according to claim 2, comprising:
metal tracks running in the second direction in parallel with the semiconductor strips, and
metal contacts connecting the metal tracks to the semiconductor strips, the metal contacts being regularly disposed between groups of at least one diode along the second direction.

4. The device according to claim 1, comprising:
metal contacts respectively in contact with the anodes; and
memory cells respectively electrically coupled to the anodes via the metal contacts.

5. A non-volatile memory comprising:
a semiconductor substrate;
an insulating layer situated on top of the semiconductor substrate;
a memory plane that includes an array of memory cells; and
a selector array of diodes configured to respectively select the memory cells of the memory plane, the diodes being arranged according to columns in a first direction and according to rows in a second direction orthogonal to the first direction, each diode including a cathode region of a first type of conductivity and an anode region of a second type of conductivity, the cathode and anode regions being superposed on each other and disposed on the insulating layer such that the insulating layer insulates the diodes from the semiconductor substrate;
wherein the semiconductor substrate and the insulating layer are part of a silicon-on-insulator substrate that includes the semiconductor strips, which are of silicon; and
the anode regions are epitaxial regions of silicon directly on the semiconductor strips.

6. The non-volatile memory according to claim 5, wherein the memory cells are resistive or phase-change memory cells.

7. The non-volatile memory according to claim 5, in which the cathode regions are respective portions of semiconductor strips running lengthwise in the second direction, wherein, for each row, the cathode regions of the diodes of the row are portions of a corresponding one of the semiconductor strips and the anode regions of the diodes of the row are semiconductor pads respectively in contact with the cathode regions of the row.

8. The non-volatile memory according to claim 7, comprising:
metal tracks running in the second direction in parallel with the semiconductor strips, and
metal contacts connecting the metal tracks to the semiconductor strips, the metal contacts being regularly disposed between groups of at least one diode along the second direction.

9. The non-volatile memory according to claim 5, comprising buffer portions of an insulating material separating the anode regions of the diodes of a same row from one another, the buffer portions having edges that are straddled by edge portions of the anode regions.

10. The non-volatile memory according to claim 5, comprising metal contacts respectively electrically coupling the anodes to the memory cells.

11. A device comprising:
a semiconductor substrate;
an insulating layer situated on top of the semiconductor substrate;
an array of diodes arranged according to columns in a first direction and according to rows in a second direction orthogonal to the first direction, each diode including a cathode region of a first type of conductivity and an anode region of a second type of conductivity, the cathode and anode regions being superposed on each other and disposed on the insulating layer such that the insulating layer insulates the diodes from the semiconductor substrate, wherein the cathode regions are respective portions of semiconductor strips running lengthwise in the second direction, wherein, for each row, the cathode regions of the diodes of the row are portions of a corresponding one of the semiconductor strips and the anode regions of the diodes of the row are semiconductor pads respectively in contact with the cathode regions of the row; and
buffer portions of an insulating material separating the anode regions of the diodes of a same row from one another, the buffer portions having edges that are straddled by edge portions of the anode regions;
wherein the cathode regions are situated directly on the insulating layer and between the anode regions and the insulating layer.

12. The device according to claim 11, comprising:
metal tracks running in the second direction in parallel with the semiconductor strips, and
metal contacts connecting the metal tracks to the semiconductor strips, the metal contacts being regularly disposed between groups of at least one diode along the second direction.

13. The device according to claim 11, comprising:
metal contacts respectively in contact with the anodes; and
memory cells respectively electrically coupled to the anodes via the metal contacts.

14. The device according to claim 11, wherein:
the substrate and insulating layer are part of a silicon-on-insulator substrate that includes the semiconductor strips, which are of silicon; and
the anode regions are epitaxial regions of silicon directly on the semiconductor strips.

15. The device according to claim 11, wherein the buffer portions comprise a superposition of a silicon nitride layer positioned between two silicon oxide layers or a layer of silicon nitride ($Si_3N_4$).

16. A device comprising:
a semiconductor substrate;
an insulating layer situated on top of the semiconductor substrate;
an array of diodes arranged according to columns in a first direction and according to rows in a second direction orthogonal to the first direction, each diode including a cathode region of a first type of conductivity and an anode region of a second type of conductivity, the cathode and anode regions being superposed on each other and disposed on the insulating layer such that the insulating layer insulates the diodes from the semiconductor substrate, wherein the cathode regions are respective portions of semiconductor strips running lengthwise in the second direction, wherein, for each row, the cathode regions of the diodes of the row are portions of a corresponding one of the semiconductor strips and the anode regions of the diodes of the row are semiconductor pads respectively in contact with the cathode regions of the row; and
buffer portions of an insulating material separating the anode regions of the diodes of a same row from one another, the buffer portions having edges that are straddled by edge portions of the anode regions;
wherein:
the substrate and insulating layer are part of a silicon-on-insulator substrate that includes the semiconductor strips, which are of silicon; and
the anode regions are epitaxial regions of silicon directly on the semiconductor strips.

17. The device according to claim 16, in which the cathode regions are situated directly on the insulating layer and between the anode regions and the insulating layer.

18. The device according to claim 16, in which the cathode regions are respective portions of the semiconductor strips running lengthwise in the second direction, wherein, for each row, the cathode regions of the diodes of the row are portions of a corresponding one of the semiconductor strips and the anode regions of the diodes of the row are semiconductor pads respectively in contact with the cathode regions of the row.

19. The device according to claim 16, comprising:
metal tracks running in the second direction in parallel with the semiconductor strips, and
metal contacts connecting the metal tracks to the semiconductor strips, the metal contacts being regularly disposed between groups of at least one diode along the second direction.

20. The device according to claim 16, comprising:
metal contacts respectively in contact with the anodes; and
memory cells respectively electrically coupled to the anodes via the metal contacts.

21. The device according to claim 16, wherein the buffer portions comprise a superposition of a silicon nitride layer positioned between two silicon oxide layers or a layer of silicon nitride ($Si_3N_4$).

* * * * *

UNITED STATES PATENT AND TRADEMARK OFFICE
CERTIFICATE OF CORRECTION

PATENT NO. : 10,002,906 B2
APPLICATION NO. : 15/365143
DATED : June 19, 2018
INVENTOR(S) : Francesco La Rosa et al.

Page 1 of 1

It is certified that error appears in the above-identified patent and that said Letters Patent is hereby corrected as shown below:

On the Title Page

Item (*) Notice:
"0 days. days." should read --0 days.--.

Signed and Sealed this
Tenth Day of November, 2020

Andrei Iancu
*Director of the United States Patent and Trademark Office*